United States Patent
Cooper et al.

(10) Patent No.: US 8,547,064 B2
(45) Date of Patent: Oct. 1, 2013

(54) BATTERY CELL TAB MONITOR

(75) Inventors: J. Randall Cooper, Lucas, TX (US); Weibiao Zhang, Plano, TX (US); Kyl W. Scott, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 775 days.

(21) Appl. No.: 12/687,173

(22) Filed: Jan. 14, 2010

(65) Prior Publication Data

US 2011/0169452 A1   Jul. 14, 2011

(51) Int. Cl.
*H02J 7/00* (2006.01)
*G01R 31/36* (2006.01)

(52) U.S. Cl.
USPC ........... 320/116; 320/112; 320/124; 320/130; 320/132; 324/429; 324/427

(58) Field of Classification Search
USPC ........................................ 320/116
See application file for complete search history.

(56) References Cited

U.S. PATENT DOCUMENTS

| 6,504,344 | B1 | 1/2003 | Adams et al. |
| 7,336,081 | B2 | 2/2008 | Kasamatsu et al. |
| 2008/0164881 | A1 | 7/2008 | Miyamoto |
| 2009/0009133 | A1 | 1/2009 | Tange et al. |
| 2009/0130542 | A1 | 5/2009 | Mizoguchi et al. |

OTHER PUBLICATIONS

PCT Search Report mailed Aug. 26, 2011.

*Primary Examiner* — Yalkew Fantu
(74) *Attorney, Agent, or Firm* — William B. Kempler; W. James Brady, III; Frederick J. Telecky, Jr.

(57) ABSTRACT

A battery cell tab monitoring apparatus includes a conductive element electrically connected between two battery cells. The conductive element is connected to a sensing circuit including a pull-down current source connected to pull current from the conductive element and/or a pull-up current source connected to drive current into the conductive element. A voltage measuring circuit is connected to sense voltages during operation of the pull-down current source and the pull-up current source to be used to determine the status of the conductive element. For instance, voltages beyond certain fixed or variable thresholds indicate that the conductive element is flexing or cracking, which can be a precursor to its breaking. Voltages beyond other fixed or variable thresholds indicate that the conductive element is fully disconnected. The current sources used to push and pull the sensing currents may be used to bring the battery cells into balance when an imbalance is detected.

17 Claims, 10 Drawing Sheets

BATTERY CELL TAB MONITOR

TECHNICAL FIELD

This invention relates generally to voltage measuring devices and more specifically to monitoring battery cells in a battery stack.

BACKGROUND

It is common to power electronic devices with battery packs containing two or more battery cells. For instance, two or more battery cells may be stacked in series to produce a higher voltage to power various electronic devices. The batteries are monitored to provide a user of the powered device with information regarding the amount of energy remaining in the battery. In some applications, each cell of a battery stack is monitored because the voltage for each cell may drift too high or too low for a particular application or a particular cell may stop working, affecting the overall performance of the battery stack.

Circuits that monitor the battery cells in the battery pack monitor the voltage across each cell and the voltage for the entire series. Typically, a mechanical tab electrically connects each battery cell to the monitoring circuit. The mechanical tab over time may become disconnected due to physical conditions such as dropping the battery pack. When the tab becomes disconnected from the battery cells, the circuit loses the ability to monitor individual cells.

SUMMARY

Generally speaking, pursuant to these various embodiments, a battery cell tab monitoring apparatus includes a conductive element electrically connected between two battery cells. The conductive element is connected to a sensing circuit. The sensing circuit includes a pull-down current source connected to pull current from the conductive element and/or a pull-up current source connected to drive current into the conductive element. A voltage measuring circuit is connected to sense voltages during operation of the pull-down current source and the pull-up current source. The measured voltage may be used to determine the status of the conductive element. For instance, absolute voltages or voltage variations beyond certain thresholds can indicate that the conductive element such as a battery cell tab is flexing or cracking, which can be a precursor to the breaking of the battery cell tab. Absolute voltages or voltage variations beyond other thresholds can indicate that the conductive element is fully disconnected from the battery cells.

One approach to sensing the different absolute voltages and voltage variations is to push and pull different currents to and from the conductive element. Alternating the pushing and pulling reduces battery cell imbalance caused by the voltage checks and provides an opportunity to make additional voltage readings. The current sources used to push and pull the sensing currents may also be used to bring the battery cells into balance when an imbalance is detected. These and other benefits may become clear upon making a thorough study of the following detailed description.

BRIEF DESCRIPTION OF THE DRAWINGS

The above needs are at least partially met through the provision of the battery cell tab monitor described in the following detailed description, particularly when studied in conjunction with the drawings wherein:

FIGS. 4-6 are sample waveforms that may be observed in the system when configured in accordance with various embodiments of the invention.

Skilled artisans will appreciate that elements in the figures are illustrated for simplicity and clarity and have not necessarily been drawn to scale. For example, the dimensions and/or relative positioning of some of the elements in the figures may be exaggerated relative to other elements to help to improve understanding of various embodiments of the present invention. Also, common but well-understood elements that are useful or necessary in a commercially feasible embodiment are often not depicted in order to facilitate a less obstructed view of these various embodiments. It will further be appreciated that certain actions and/or steps may be described or depicted in a particular order of occurrence while those skilled in the art will understand that such specificity with respect to sequence is not actually required. It will also be understood that the terms and expressions used herein have the ordinary technical meaning as is accorded to such terms and expressions by persons skilled in the technical field as set forth above except where different specific meanings have otherwise been set forth herein.

DETAILED DESCRIPTION OF THE PREFERRED EMBODIMENT(S)

Figure 1:
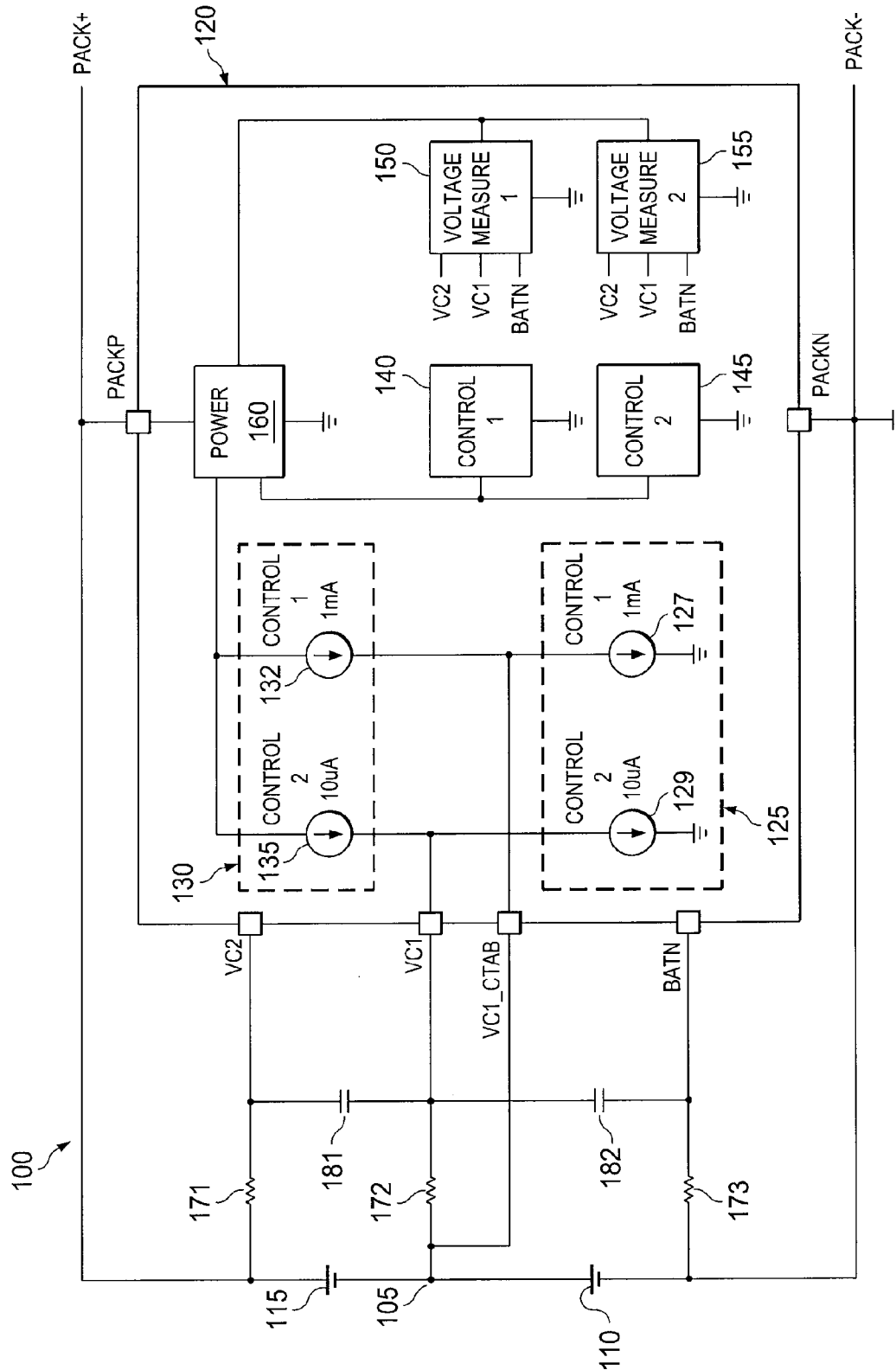
FIG. 1 comprises a circuit diagram of an example battery cell tab monitor configured in accordance with various embodiments of the invention.

Referring now to the drawings, and in particular to FIG. 1, an illustrative circuit 100 compatible with many of these teachings will now be presented. The circuit 100 includes a conductive element 105 electrically connected to a first battery cell 110 and a second battery cell 115. The conductive element 105 is electrically connected to a sensing circuit 120. The sensing circuit 120 includes a pull-down current source 125 connected to pull current from the conductive element 105. The sensing circuit 120 also includes a pull-up current source 130 connected to drive current into the conductive element 105. The circuit 100 may also include a power regulation block 160 to provide regulated power to the other blocks contained in circuit 100.

Although the pull-down current source 125 and the pull-up current source 130 can each operate with just one current source, in a different approach each may include multiple, independently controllable current sources. In the example of FIG. 1, the pull-down current source 125 includes a first pull-down current source 127 and a second pull-down current source 129. In this example, the pull-up current source 130 includes a first pull-up current source 132 and a second pull-up current source 135. In this example, the sensing circuit 120 contains a first control circuit 140 and a second control circuit 145. In one approach, the first pull-down current source 127 provides about 1 milliampere of current and is controlled by the first control circuit 140. The second pull-down current source 129 provides about 10 microamperes of current and is controlled by the second control circuit 145. Similarly, the first pull-up current source 132 provides about 1 milliampere of current and is controlled by the first control circuit 140 and the second pull-up current source 135 provides about 10 microamperes of current and is controlled by the second control circuit 145.

The control circuits 140 and 145 may be hardware based controllers or firmware based controllers. In one approach, the first control circuit 140 comprises a hardware based controller that can turn on and off the first pull-up current source 132 and the first pull-down current source 127. The second control circuit 145 comprises a firmware based controller that can turn on and off the second pull-up current source 135 and the second pull-down current source 129.

Figure 2:
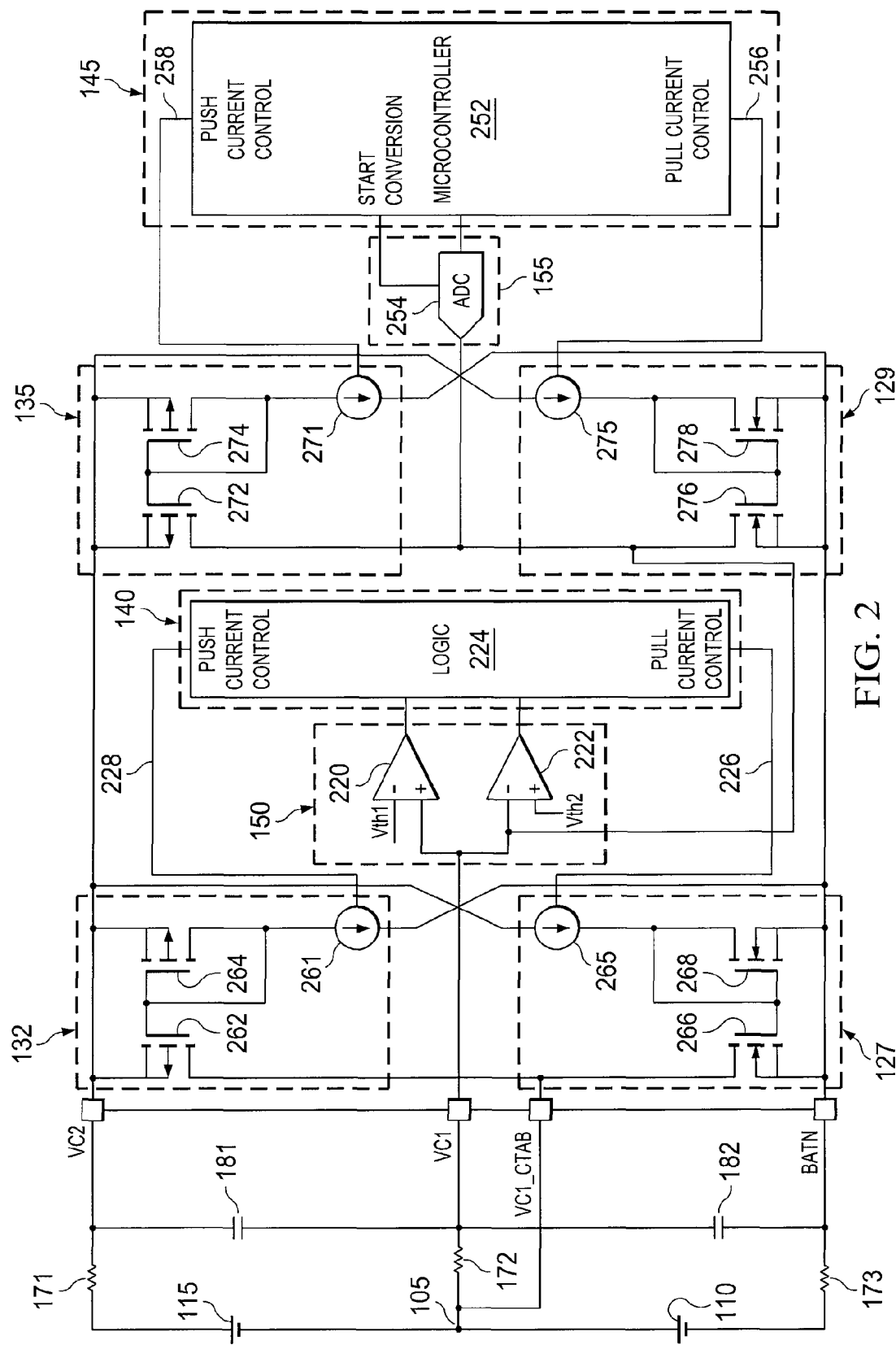
FIG. 2 comprises a circuit diagram of an example battery cell tab monitor configured in accordance with various embodiments of the invention.

With reference to FIG. 2, an example approach to the control circuits 140 and 145 will be described. A hardware based controller 140 includes logic to control the pull-up current source 132 and the pull down current source 127 as well as logic to make decisions based on the outputs from the voltage measurement block 150. The voltage measurement block 150 contains comparators 220 and 222 connected to compare voltages from the conductive element 105 to different threshold voltages Vth1 and Vth2 as described in more detail below. The signals from the comparators 220 and 222 are provided to a hardware logic element 224, such as known to those skilled in the art, that in turn provides a push current control 228 signal to control the first pull-up current source 132 and a pull current control 226 signal to control the first pull-down current source 127. The pull-up current source 132 is comprised of a main current reference 261 and current mirror transistors 262 and 264. Likewise, the pull-down current source 127 is comprised of a main current reference 265 and current mirror transistors 266 and 268.

A firmware based controller 145 as shown in FIG. 2 includes a microcontroller 252 connected to an analog to digital converter 254. In this approach, the analog to digital converter 254 is connected to receive voltages from the conductive element 105 and convert those voltage signals to a digital signal for processing by the microcontroller 252. The microcontroller 252 is connected to control the operation of the analog to digital converter 254. The microcontroller 252 is also programmed and configured to create and send a push current control 258 signal to control the second pull-up current source 135 and a pull current control 256 signal to control the second pull-down current source 129 based upon the voltage digital signals provided by the analog to digital converter 254. The pull-up current source 135 is comprised of a main current reference 271 and current mirror transistors 272 and 274. Likewise, the pull-down current source 129 is comprised of a main current reference 275 and current mirror transistors 276 and 278.

With reference again to FIG. 1, the sensing circuit 100 includes a voltage measuring circuit 150 connected to sense voltages during operation of the pull-down current source 127 and the pull-up current source 132. The sensing circuit 100 contains a second voltage measuring circuit 155 connected to sense voltages during operation of the pull-down current source 129 and the pull-up current source 135.

In the example of FIG. 1, the control circuit 140 and the voltage measuring circuit 150 are connected to determine the status of the conductive element 105. For example, voltage measuring circuit 150 can compare voltage measured during operation of the pull-down current source 127 to a first voltage threshold and the voltage measuring circuit 150 can compare the voltage measured during operation of the pull-up current source 132 to a second voltage threshold. Based on the comparisons of the measured voltages to either fixed thresholds or on the measured voltage variations, the control circuit 140 can determine the status of the conductive element 105.

Likewise, voltage measuring circuit 155 can compare voltage measured during operation of the pull-down current source 129 to a third voltage threshold and the voltage measuring circuit 155 can compare the voltage measured during operation of the pull-up current source 135 to a fourth voltage threshold. Based on the comparisons of the measured voltages to either fixed thresholds or on the measured voltage variations, the control circuit 145 can determine the status of the conductive element 105.

In this example, the control circuit 140 controls the pull-up current source 132 and the pull-down current source 127 to alternate in operation to balance the load on the first battery cell 110 and the second battery cell 115. In addition to balancing the load on the battery cells 110 and 115, alternating between the pull-down current source 127 and the pull-up current source 132 allows the voltage measuring circuit 150 to compare voltage variations in both the positive and negative directions to confirm the accuracy of the measurements. For example, a measurement made during operation of the pull-down current source 127 can be compared to a measurement made during operation of the pull-up current source 132 to determine whether a given measurement lies within an expected range such that spurious measurements can be disregarded.

In other approaches, the circuit 100 need not include both a pull-up current source 130 and a pull-down current source 125. For example, if the circuit 100 includes other known load balancing mechanisms, the need to use the pull-up current source 130 and pull-down current source 125 to reduce load imbalance is reduced, and one of the pull-up current source 130 or the pull-down current source 125 can be implemented to perform the voltage checks as described herein. In such an approach, the elements of the unused current source can be removed or left out of the circuit 100.

In another approach using multiple current sources, the control circuit 140 operates the first pull-down current source 127 and/or the first pull-up current source 132 periodically to determine whether the conductive element 105 electrical connection is intact. The control circuit 145 may operate the second pull-down current source 129 and/or the second pull-up current source 135 periodically to monitor quality of the conductive element 105 electrical connection.

In one such example, the first pull-down current source 127 is controlled to pull about one milliampere out of the conductive element 105 for about two milliseconds. Then, the first pull-up current source 132 is controlled to push about one milliampere into the conductive element 105 for about two milliseconds. In this example, this check is performed once every eight seconds. If the electrically conductive element 105 is disconnected from the first battery cell 110 and the second battery cell 115, the resulting voltage at the disconnect will be sensed by the voltage measuring circuit 150 both at a low threshold as occurs when the pull-down current source 127 operates and at a high threshold when the pull-up current source 132 operates. Upon meeting both these low and high thresholds on consecutive checks, the sensing circuit 120 will signal this to be a disconnected conductive element or tab such that the device enters a fault condition.

So configured, the sensing circuit 120 applies or pulls a larger current such as about one milliampere to sense whether a voltage variation reaches a certain threshold from which it may be determined that the conductive element 105 has broken and is no longer in electrical contact with the first battery cell 110 and the second battery cell 115. A smaller current, such as about 10 microamperes may be pulled from or pushed into the conductive element 105 to sense voltage variations that indicate wear of the conductive element 105.

In another application of the circuit 100, the control circuit 145 can receive information regarding relative charge of the first battery cell 110 and the second battery cell 115. In this approach, the control circuit 145 operates the pull-up current source 135 and the pull-down current source 129 to balance the relative charge of the first battery cell 110 and the second battery cell 115. In this approach, sensing circuitry as known in the art can determine an imbalance of charge between the first battery cell 110 and the second battery cell 115. The sensing circuitry in various approaches may comprise a controller circuit separate from those shown in FIG. 1 or may be in communication with control circuit 140 and/or control circuit 145. Such imbalances between cells in a battery pack can lead to poor performance including perhaps failure of the battery pack. Thus, upon determining an imbalance of charge between the first battery cell 110 and the second battery cell 115, the sensing circuit 120 can correct the imbalance of charge between the first battery cell 110 and the second battery cell 115 by pushing current or pulling current via the conductive element 105 using any of the current sources. Selective pushing and pulling of current into and out of particular battery cells can work to rebalance the relative cell charges of the battery pack. Moreover, depending on the amount of imbalance, a larger current may be applied by the first pull-down current source 127 or a smaller current may be applied by the second pull-down current source 129, depending on the amount of imbalance in the cells to be corrected.

The remainder of the example circuit 100 shown in FIG. 1 includes well known elements used for the operation of a sensing circuit 120 used in conjunction with battery cells. For instance, resistors 171, 172, and 173 work with capacitors 181 and 182 to filter voltage transients on the first battery cell 110, the second battery cell 115, and the combination of the battery cells 110 and 115. In some implementations, for example, it may be possible to omit resistors 171, 172, and 173 as well as capacitors 181 and 182. It is also possible to eliminate the circuit node VC1_CTAB and only use circuit node VC1 for both pull-down current sources and both pull-up current sources, with consideration given to the effects of resistor 172 if the VC1_CTAB circuit node is eliminated. Additional elements could be added in other approaches.

Figure 3:
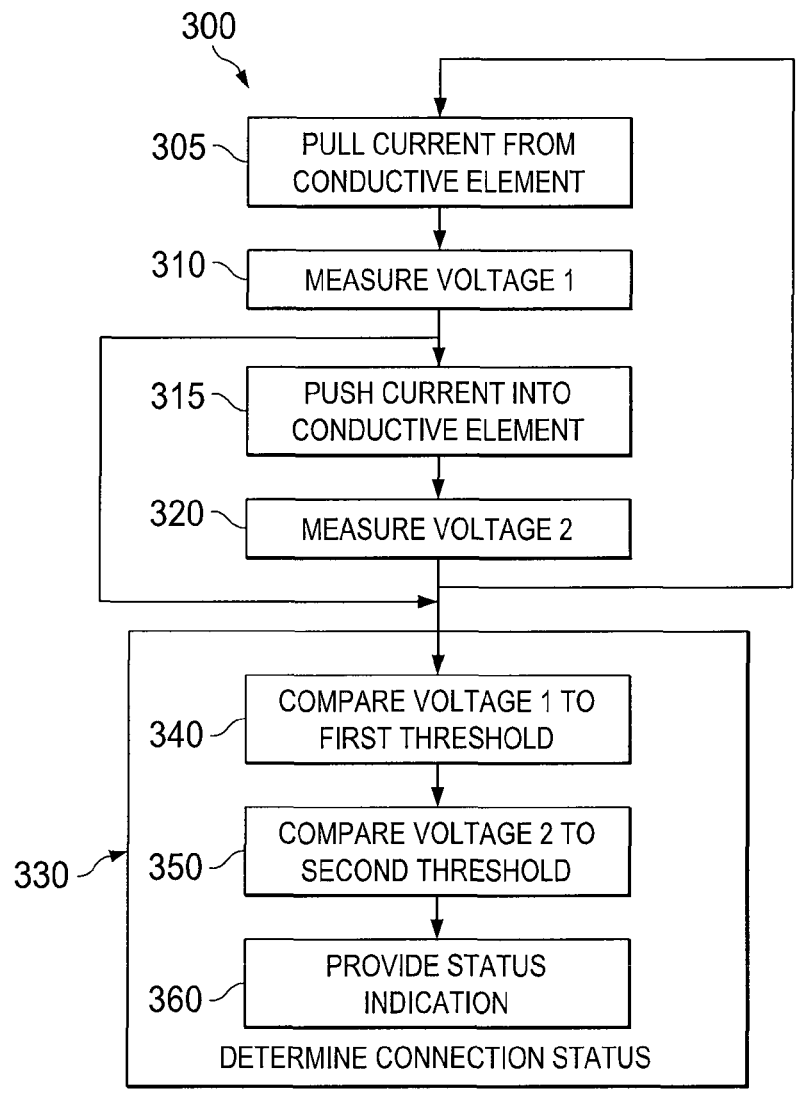
FIG. 3 comprises a flow diagram of the operation of an example battery cell tab monitor detecting a fixed voltage threshold as configured in accordance with various embodiments of the invention.

An example method of monitoring battery cell tab conditions will be described with reference to FIG. 3 and the example circuit 100 of FIG. 1. This method uses fixed voltage thresholds for determining the condition of the conductive element 105 and can be executed by either a hardware based control circuit or a firmware based control circuit. The method 300 includes at step 305 pulling current out of a conductive element 105 disposed between a first battery cell 110 and a second battery cell 115. At step 310 the method includes sensing a first voltage across the first battery cell 110 while pulling current out of the conductive element 105. At step 315 the method includes pushing current into the conductive element 105 disposed between the first battery cell 110 and the second battery cell 115 and at step 320 sensing a second voltage across the first battery cell 110 while pushing current into the conductive element 105. As shown in FIG. 3, the steps of pulling current 305 and pushing current 315 may be performed in either order. In other words, the step of pushing current 315 from the conductive element 105 may be performed before pulling current 305 through the conductive element 105. In another approach, either steps 305 and 310 or steps 315 and 320 are skipped, such that current is either pulled into or pushed from the conductive element 105; such an approach may be accompanied by application of other known load balancing methods. At step 330 the method includes determining a connection status of the conductive element 105 based at least in part the first voltage and the second voltage.

The steps of pulling current 305 out of the conductive element 105 and pushing current 315 into the conductive element 105 can be alternated periodically. In one example, either the step of pulling current 305 out of the conductive element and/or pushing the current 315 into the conductive element may include pushing or pulling a first current at a first interval and pushing or pulling a second current at a second interval. For instance, the step of pulling the first current at the first interval may include pulling a current of about one milliampere to determine whether the conductive element 105 is connected to a sensing circuit 120. The step of pulling the second current at the second interval may include pulling a current of about 10 microamperes to determine a degradation of the connection between the conductive element 105 and the sensing circuit 120.

By one approach, the step 330 of determining the connection status of the conductive element 105 is based at least in part on the voltage measured at step 310, comparing the first voltage to a first voltage threshold at step 340 and at step 350 comparing the second voltage measured at step 320 to a second voltage threshold at step 350. At step 360 an indication of the connection status of the connective element 105 is provided according to a function of the first voltage as compared to the first voltage threshold and the second voltage as compared to the second threshold. The specific voltage thresholds may vary according to a specific application.

Figure 4:
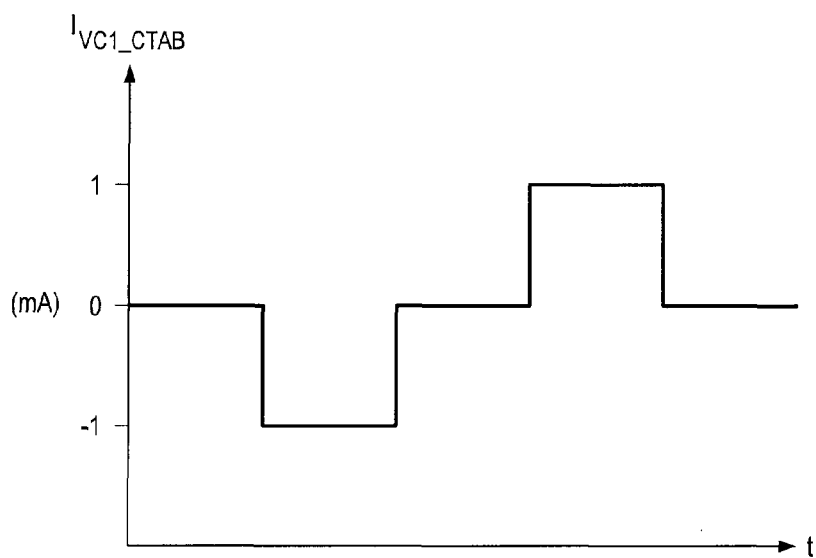
Figure 4:
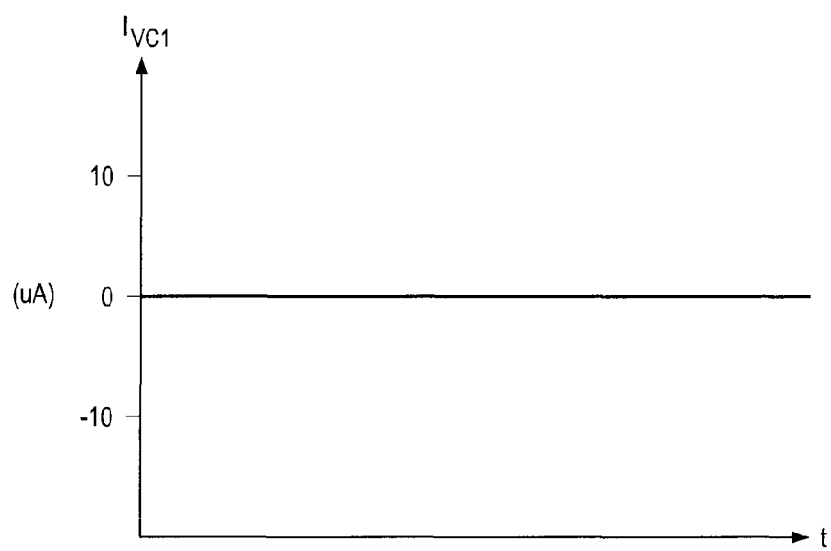
Figure 4:
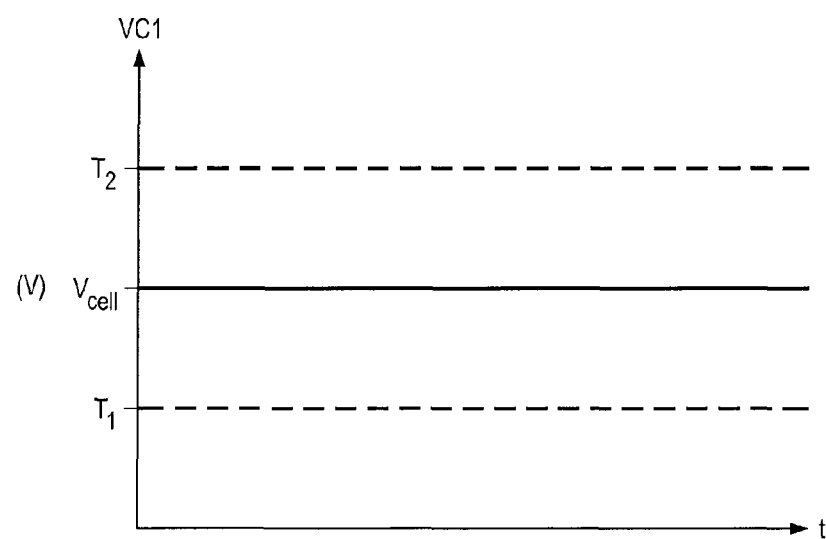

By way of example, FIG. 4 shows the current and voltage waveforms expected when a one milliampere current is applied when the conductive element 105 is connected and has a low resistance. The indicators VC1 and VC1_CTAB indicate the nodes on the example circuit of FIG. 1 where the represented currents and voltages are applied and measured. When a one milliampere current is pulled out of the VC1_CTAB node, the voltage at the VC1 node does not change appreciably and does not cross the fixed low threshold $T_1$. Similarly, when a one milliampere current is pushed into the VC1_CTAB node, the voltage at the VC1 node does not change appreciably and does not cross the fixed high threshold $T_2$. Accordingly, the conductive element 105 is declared to be connected.

Figure 5:
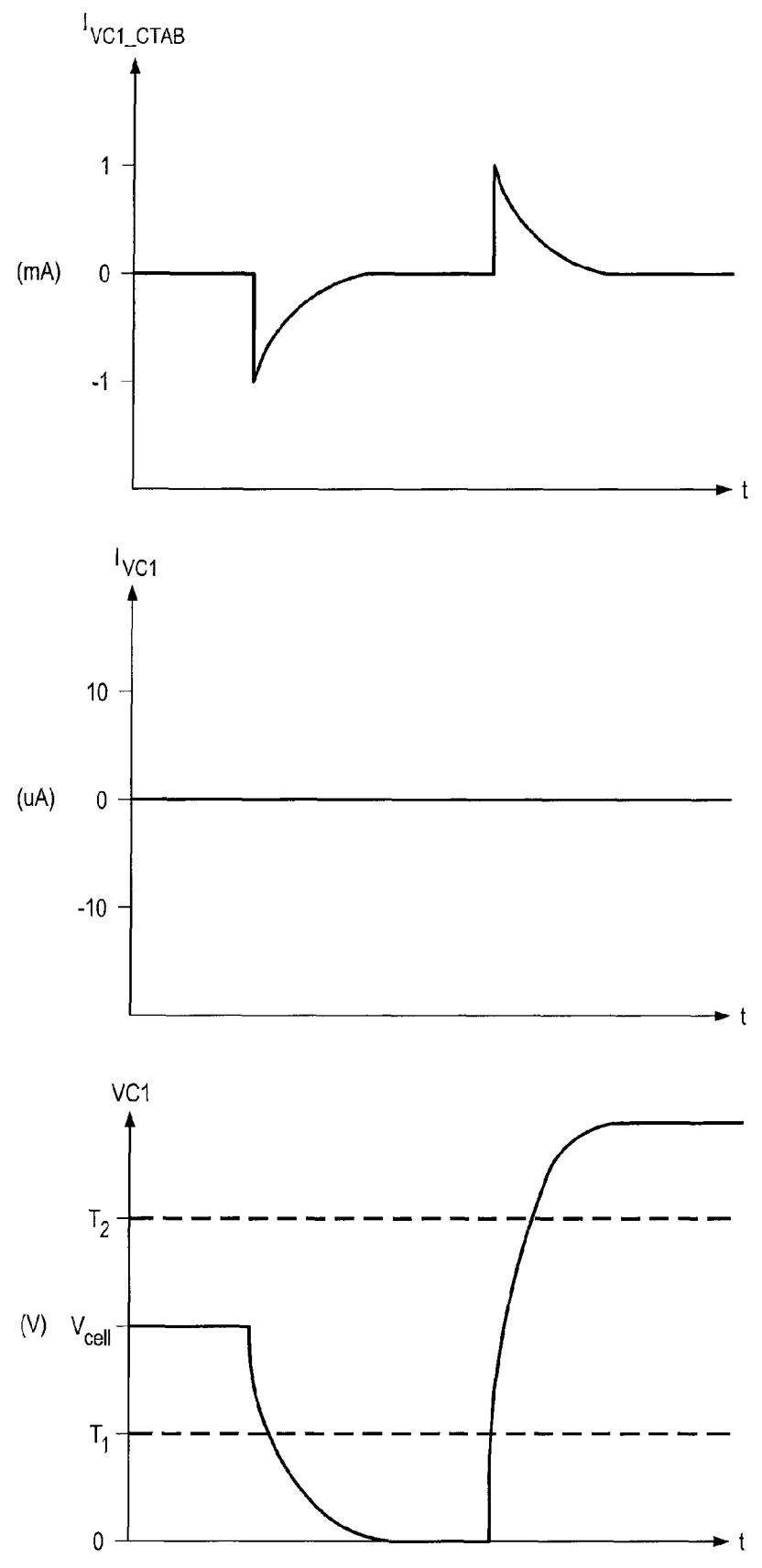

FIG. 5 shows the current and voltage waveforms expected when the conductive element 105 is disconnected or has a very high resistance. When the one milliampere current is pulled from or pushed into the VC1_CTAB node, the voltage measured at VC1 crosses the fixed low threshold $T_1$ when the pull-down current source 127 is active and crosses the fixed high threshold $T_2$ when the pull-up current source 132 is active. This condition indicates the conductive element 105 is disconnected and open.

Figure 6:
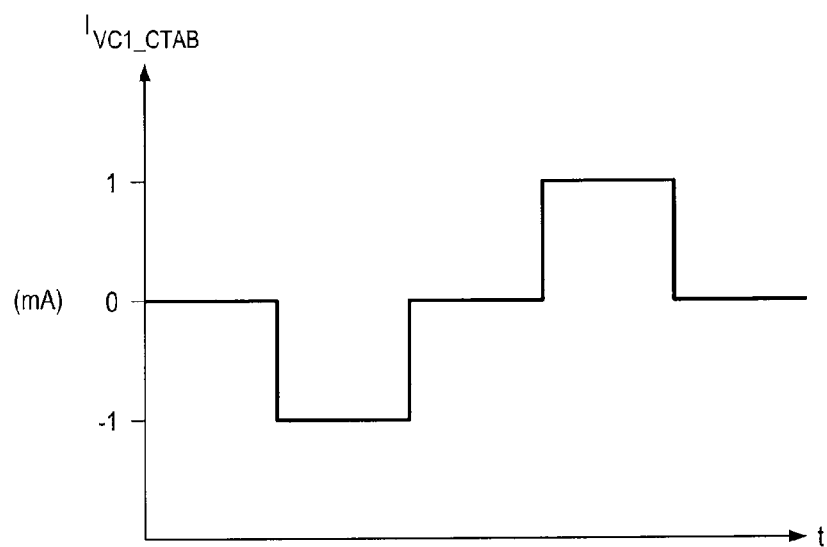
Figure 6:
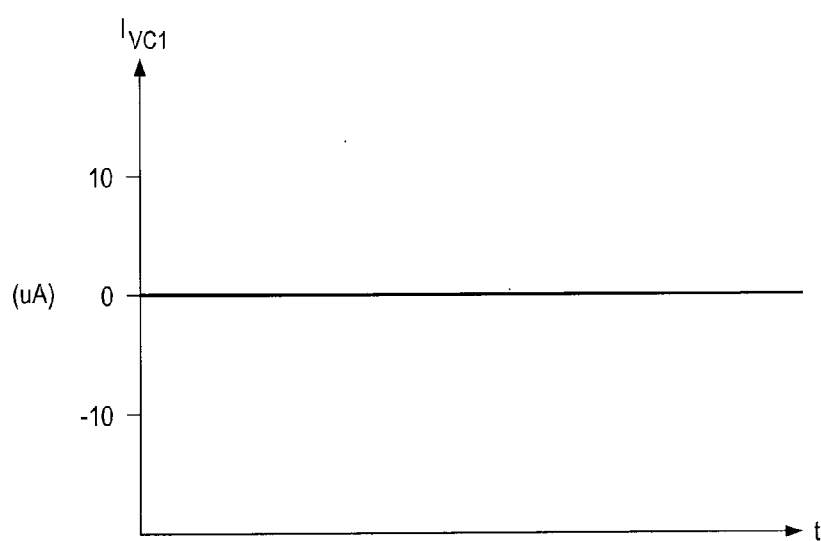
Figure 6:
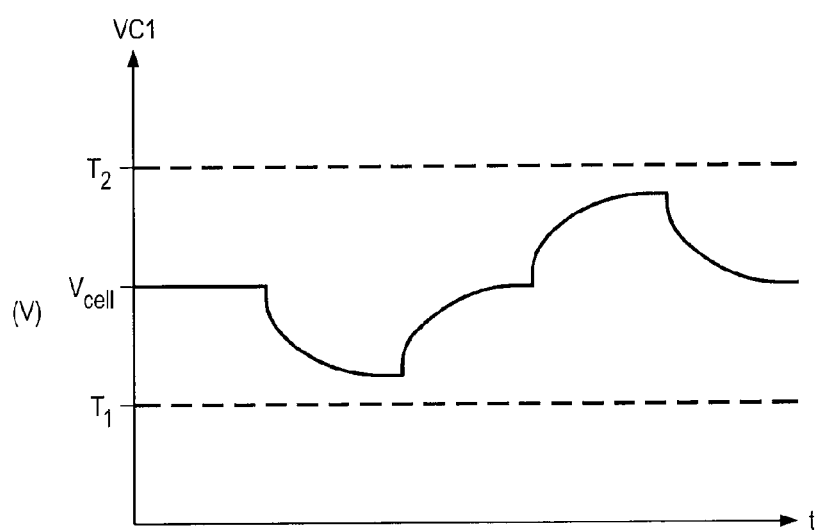

FIG. 6 shows the current and voltage waveforms expected when the conductive element 105 is connected and has a moderate resistance. When the one milliampere current is pulled from or pushed into the VC1_CTAB node, the voltage measured at VC1 varies but does not cross the fixed low threshold when the pull-down current source 127 is active or the fixed high threshold when the pull-up current source 132 is active. Because the fixed thresholds were not exceed, the system declares the conductive element 105 to be connected.

Another example method of monitoring battery cell tab conditions will be described with reference to FIG. 7 and the example circuit 100 of FIG. 1. This method uses variable voltage thresholds for determining the condition of the conductive element 105 and would be used by either a hardware based control circuit or a firmware based control circuit. The method 700 optionally includes at step 702 a measurement of the initial voltage, Vi, across the first battery cell 110. At step 705 the method includes pulling current out of a conductive element 105 disposed between a first battery cell 110 and a second battery cell 115. At step 710 the method includes measuring a voltage, V1, across the first battery cell 110 while pulling current out of the conductive element 105. At step 715 the method includes pushing current into the conductive element 105 disposed between the first battery cell 110 and the second battery cell 115 and at step 720 measuring a voltage, V2, across the first battery cell 110 while pushing current into the conductive element 105.

Figure 7:
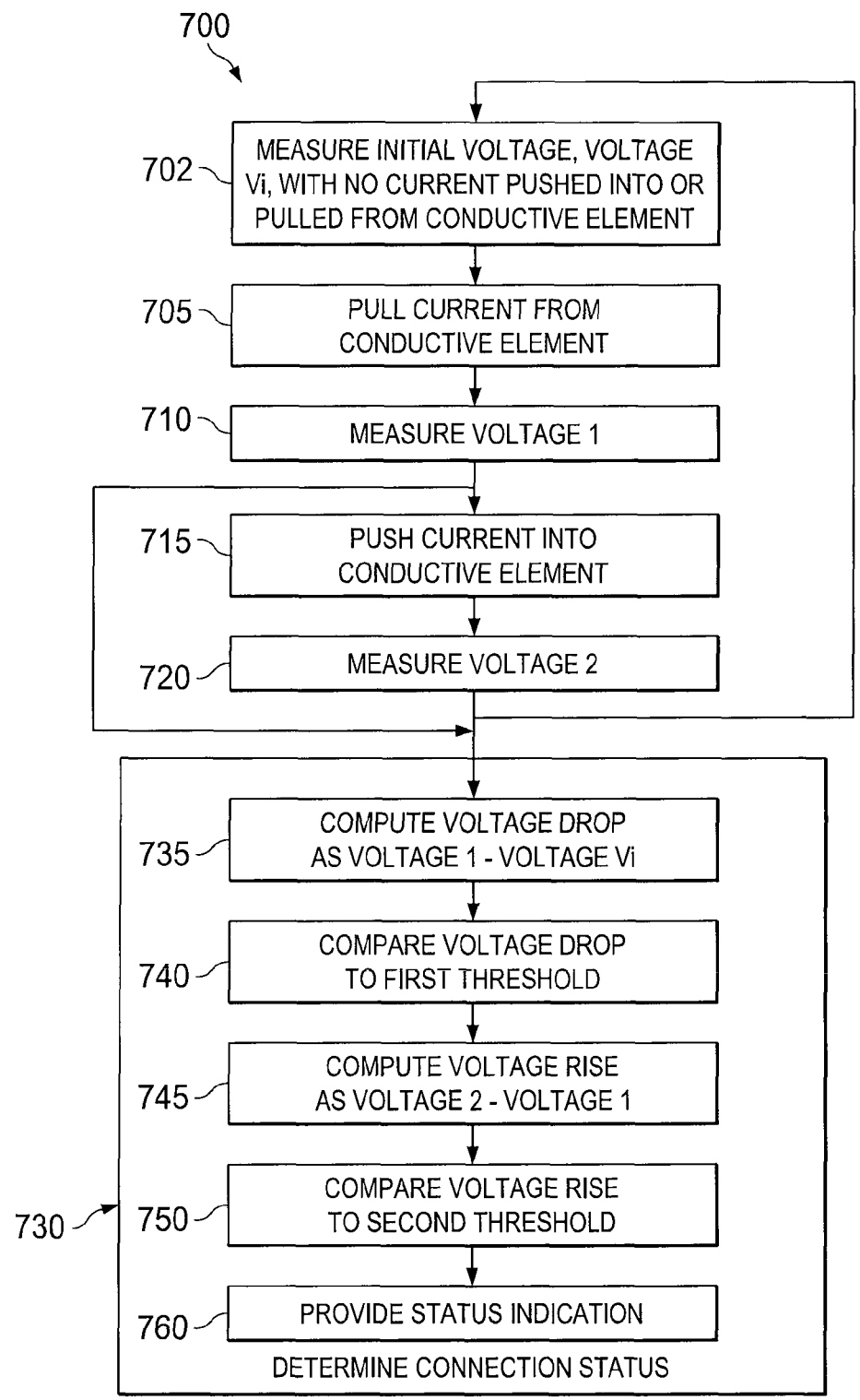
FIG. 7 comprises a flow diagram of the operation of an example battery cell tab monitor detecting a voltage shift as configured in accordance with various embodiments of the invention.

As shown in the example of FIG. 7, the steps of pulling current 705 and pushing current 715 may be performed in either order. In other words, the step of pushing current 715 into the conductive element 105 may be performed before pulling current 705 through the conductive element 105. In another approach, either steps 705 and 710 or steps 715 and 720 are skipped, such that current is either pulled into or pushed from the conductive element 105; such an approach may be accompanied by application of other known load balancing methods. At step 730 the method includes determining a connection status of the conductive element 105 based at least in part on the changes in voltage measured at steps 710 and 720.

By one approach, determining the connection status includes computing the voltage drop from Vi to V1 and the voltage rise from V1 to V2 at step 735 and then comparing the voltage drop to a first threshold to make a first comparison at step 740 and comparing the voltage rise to a second voltage threshold to make a second comparison at step 750. In this approach, the first threshold and the second threshold are determined based on the last measured voltage such that the thresholds are measuring the total voltage change during a particular operation of one of the current sources. At step 760 the method includes providing an indication of the connection status of the conductive element according to the first comparison and the second comparison. Other approaches to determining the connection status are possible, including the other methods discussed herein.

In one such example, a firmware based control circuit 145 can command a 10 microampere current to be pulled out of the center tab or conductive element 105 for about 8 milliseconds. The control circuit 145 then turns off the pull-down current source 129 for 10 milliseconds, followed by the control circuit 145 controlling the second pull-up current source 135 to provide 10 microamperes of current to the conductive element 105 for about 8 milliseconds. If the conductive element 105 is partially disconnected, the control circuit 145 is able to detect voltage at the conductive element 105 moving due to the 10 microampere current being pulled from or pushed into the conductive element 105. This moving voltage is an indication of wear on the conductive element 105 or center tab disposed between the first battery cell 110 and the second battery cell 115.

Figure 8:
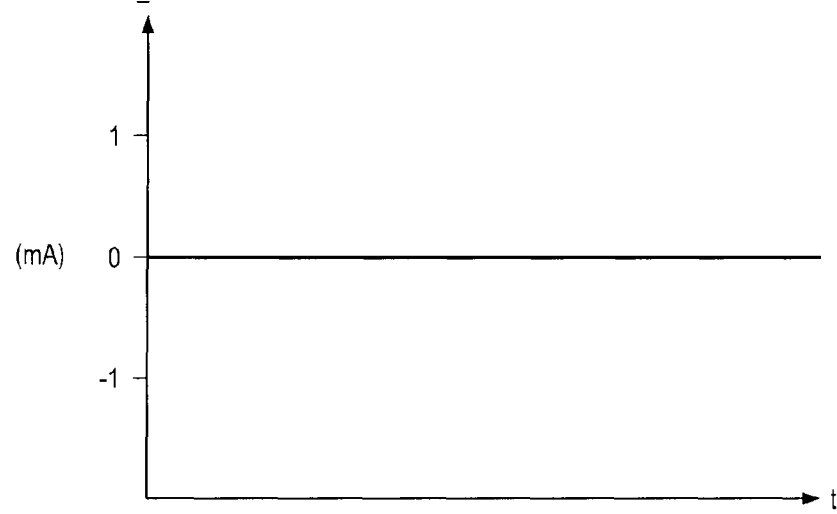
FIGS. 8-10 are sample waveforms that may be observed in the system when configured in accordance with various embodiments of the invention.
Figure 8:
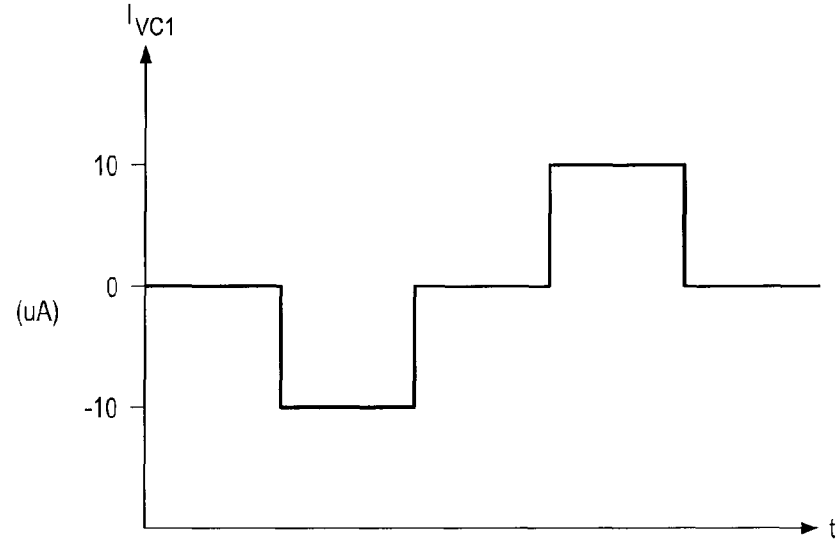
Figure 8:
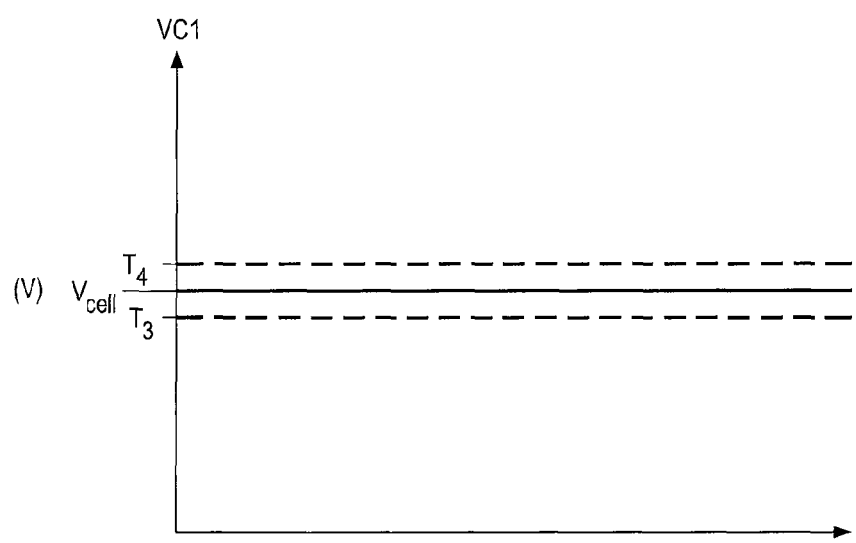

By way of example, FIG. 8 shows the current and voltage waveforms expected when a 10 microampere current is applied when the conductive element 105 is connected and has a low resistance. The indicators VC1 and VC1_CTAB indicate the nodes on the example circuit of FIG. 1 where the represented currents and voltages are applied and measured. When a 10 microampere current is pulled out of the VC1_CTAB node, the voltage at the VC1 node does not change appreciably from the initial voltage and does not cross the variable low threshold $T_3$. Similarly, when a 10 microampere current is pushed into the VC1_CTAB node, the voltage at the VC1 node does not change appreciably and does not cross the variable high threshold $T_4$. Accordingly, the conductive element 105 is declared to be connected.

Figure 9:
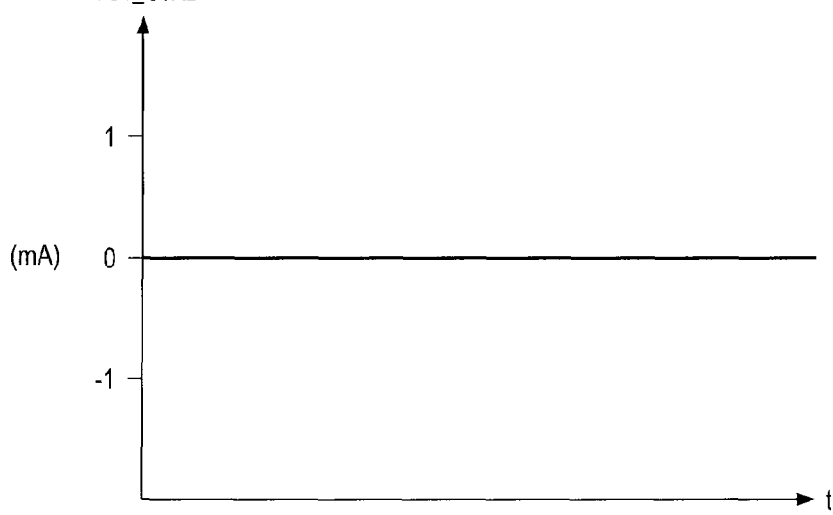
Figure 9:
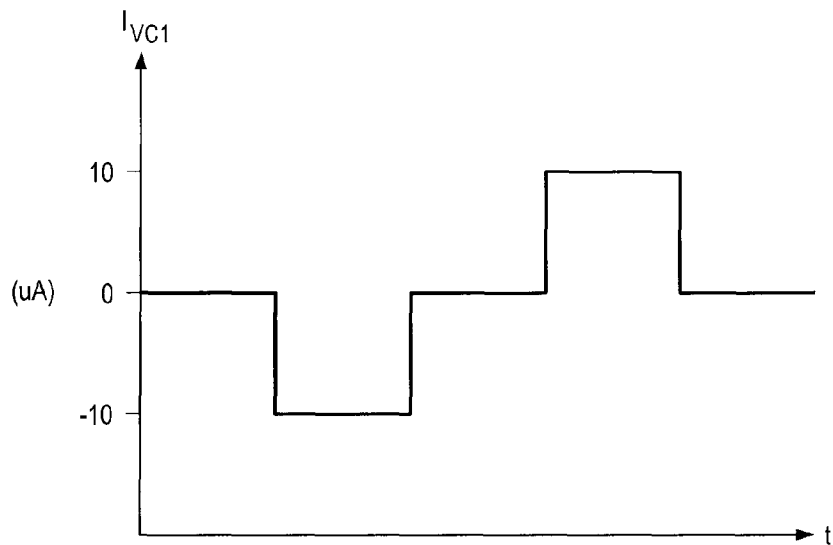
Figure 9:
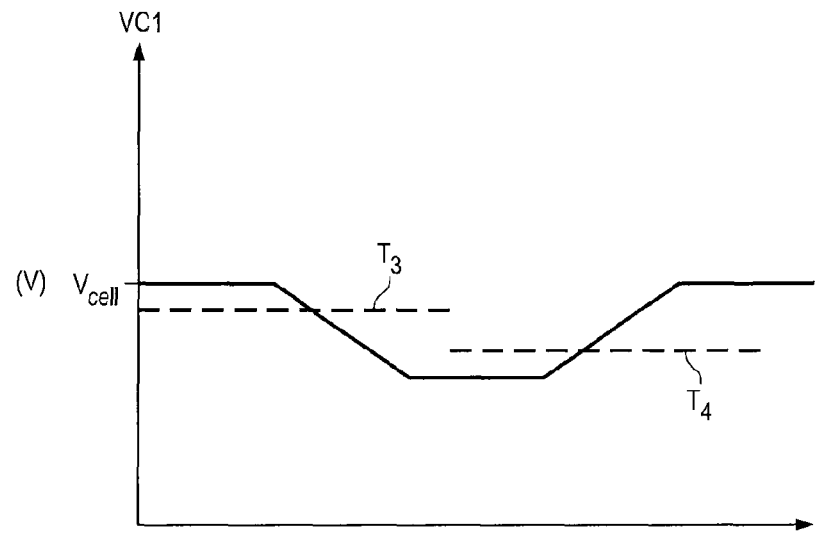

FIG. 9 shows one possible set of current and voltage waveforms expected when the conductive element 105 is disconnected or has a very high resistance. When the 10 microampere current is pulled from or pushed into the VC1_CTAB node, the voltage measured at VC1 crosses the variable low threshold $T_3$ when the pull-down current source 129 is active and crosses the variable high threshold $T_4$ when the pull-up current source 135 is active. This condition indicates the conductive element 105 is disconnected and open. One can see from this example that the low threshold $T_3$ and the high threshold $T_4$ measure a voltage delta or change during the application of current from the current sources. Thus the high threshold $T_4$ is measured from the voltage at the start of the application of current from the pull-down current source 129.

Figure 10:
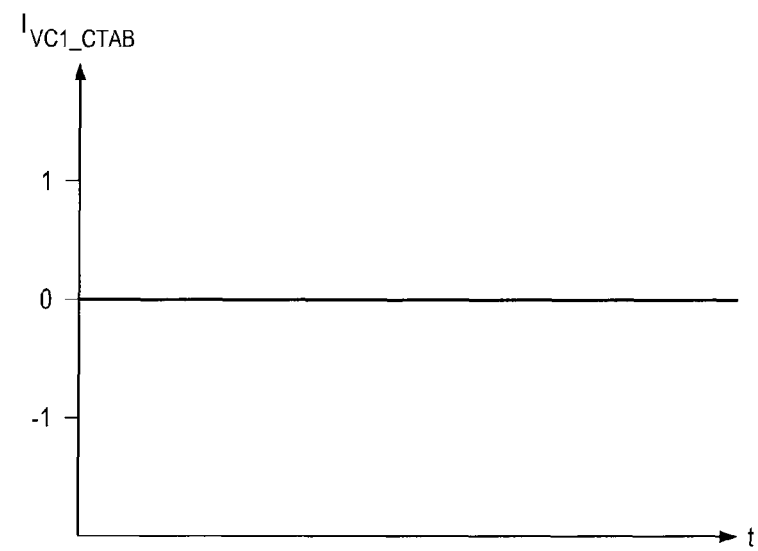
Figure 10:
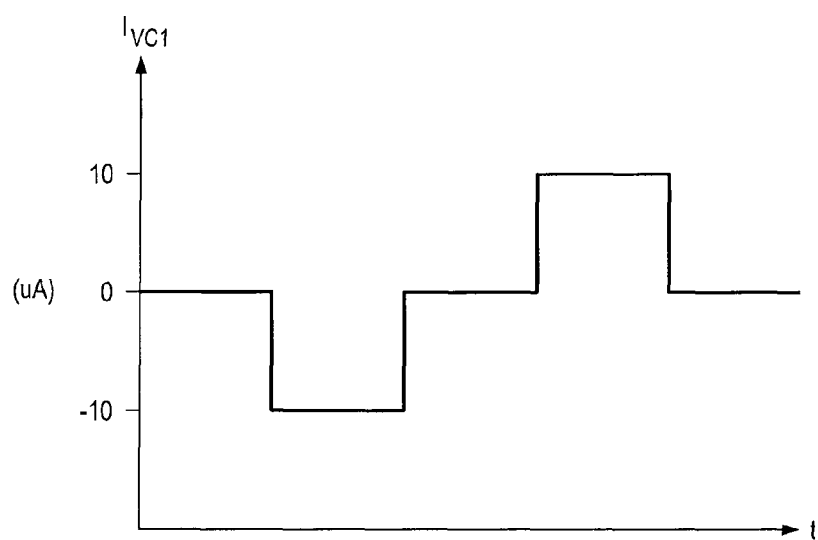
Figure 10:
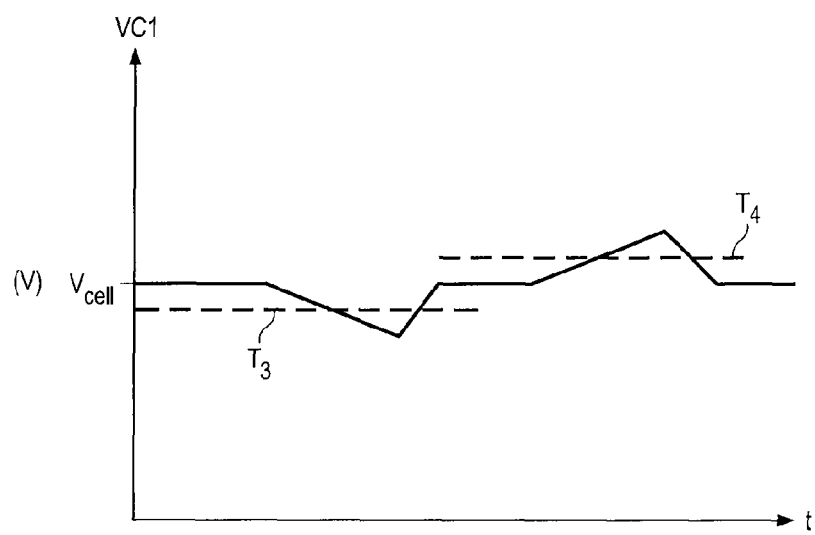

FIG. 10 shows one possible set of current and voltage waveforms expected when the conductive element 105 is connected and has a moderate resistance. In this example, unlike the example of FIG. 5, the voltage measured at the VC1 node crosses the low threshold $T_3$ when the pull-down current source 129 is active and the high threshold $T_4$ when the pull-up current source 135 is active. The thresholds may be variable to test various conditions. Accordingly, when a particular threshold is crossed, it is possible to determine the magnitude of the resistance, and thus the amount of wear, of the conductive element 105.

Referring again to FIG. 1, a particular example circuit for performing this method would include a conductive element 105 electrically connected to a first battery cell 110 and a second battery cell 115 and electrically connected to a sensing circuit 120. The sensing circuit 120 includes a first pull-down current source 127 connected to periodically pull a first current from the conductive element 105 for a first amount of time and a first pull-up current source 132 connected to periodically push current approximately equal to the first current into the conductive element 105 for approximately the first amount of time. A second pull-down current source 129 is connected to periodically pull a second current from the conductive element 105 for a second amount of time, and a second pull-up current source 135 is connected to periodically drive current approximately equal to the second current into the conductive element 105 for approximately the second amount of time. In this example, the first current comprises about 1 milliampere of current and the second current comprises about 10 microamperes of current.

A first control circuit 140 is connected to control operation of the first pull-down current source 127, the first pull-up current source 132, and a second control circuit 145 is connected to control operation of the second pull-down current source 129, and the second pull-up current source 135. A first voltage measuring circuit 150 is connected to sense voltages during operation of the first pull-down current source 127 and the first pull-up current source 132, and a second voltage measuring circuit 155 is connected to sense voltages during operation of the second pull-down current source 129 and the second pull-up current source 135.

The control circuits 140 and 145 are connected to determine a status of the conductive element 105 based at least in part on the measured voltages such that the control circuits 140 and 145 compare voltages during operation of at least one of the first pull-down current source 127 and the first pull-up current source 132 to a first voltage threshold, and the control circuits 140 and 145 compare voltages during operation of at least one of the second pull-down current source 129 and the second pull-up current source 135 to a second voltage threshold. In this example, the first pull-down current source 127 and the first pull-up current source 132 are controlled by at least one hardware based control circuit 140, and the second pull-down current source 129 and the second pull-up current source 135 are controlled by at least one firmware based control circuit 145 The control circuit 145 can also be configured to receive information regarding relative charge of the first battery cell 110 and the second battery cell 115 and wherein the controller circuit 145 operates the second pull-up current source 135 and the second pull-down current source 129 to balance the relative charge of the first battery cell 110 and the second battery cell 115.

So configured, a battery cell tab monitoring circuit as described herein can determine when the connection tab between two battery cells is disconnected and when the battery cell tab is exhibiting signs of wear that can be a precursor to breaking of the battery cell tab. Versions of the circuit also enable selective pushing and pulling of current into and out of the battery cell tab to balance the charge of battery cells in a battery stack when the battery cell charges become imbalanced.

Those skilled in the art will recognize that a wide variety of modifications, alterations and combinations can be made with respect to the above-described embodiments without departing from the scope of the invention. For example, the circuit described above can be applied to monitor multiple battery cell tabs disposed between multiple battery cells in a battery stack comprising three or more battery cells. Also, the particular currents and timing described herein can be adapted for use to a variety of different applications. Such modifications, alterations and combinations are to be viewed as being within the ambit of the inventive concept.

What is claimed is:

1. A battery cell tab monitoring circuit electrically connected to a conductive element electrically connected to a first battery cell and a second battery cell, the circuit comprising:
    a current source connected to pull current from the conductive element or drive current into the conductive element;
    a controller circuit connected to control operation of the current source;
    a voltage measuring circuit connected to sense voltages during operation of the current source; and
    the controller circuit connected to determine a status of the conductive element based at least in part on the voltage measurement, wherein the current source comprises a pull-down current source connected to pull current from the conductive element and a pull-up current source connected to drive current into the conductive elements, the pull-down current source comprising a first pull-down current source and a second pull-down current source and wherein the pull-up current source comprises a first pull-up current source and a second pull-up current source.

2. The battery cell tab monitoring circuit of claim 1 wherein the controller circuit operates the first pull-down current source and the first pull-up current source periodically to determine whether the conductive element electrical connection is intact.

3. The battery cell tab monitoring circuit of claim 1 wherein the controller circuit operates the second pull-down current source and the second pull-up current source periodically to monitor quality of the conductive element electrical connection.

4. A battery cell tab monitoring circuit electrically connected to a conductive element electrically connected to a first battery cell and a second battery cell, the circuit comprising:
    a current source connected to pull current from the conductive element electrically connected to a first battery cell and a second battery cell or drive current into the conductive element;
    a controller circuit connected to control operation of the current source;
    a voltage measuring circuit connected to sense voltages during operation of the current source; and
    the controller circuit connected to determine a quality of conduction status of the conductive element based at least in part on the voltage measurement,
    wherein the current source comprises a pull-down current source connected to pull current from the conductive element and a pull-up current source connected to drive current into the conductive elements and
    wherein the controller circuit controls the pull-up current source and the pull-down current source to alternate in operation to balance load on the first battery cell and the second battery cell.

5. The battery cell tab monitoring circuit of claim 4 wherein the controller circuit compares voltages during operation of the pull-down current source to a first voltage fixed or variable threshold, and wherein the controller circuit compares voltages during operation of the pull-up current source to a second fixed or variable voltage threshold.

6. The battery cell tab monitoring circuit of claim 4 wherein the controller circuit receives information regarding relative charge of the first battery cell and the second battery cell and the controller circuit operates the pull-up current source and the pull-down current source to balance the relative charge of the first battery cell and the second battery cell.

7. A method of monitoring battery cell conditions comprising:
    pulling current out of a conductive element disposed between a first battery cell and a second battery cell;
    sensing a first voltage across the first battery cell while pulling current out of the conductive element;
    pushing current into the conductive element disposed between the first battery cell and the second battery cell;
    sensing a second voltage across the first battery cell while pushing current into the conductive element;
    determining a connection status of the conductive element based at least in part on the first voltage and the second voltage.

8. The method of claim 7 wherein the pushing current into the conductive element and the pulling current out of the conductive element are alternated periodically.

9. The method of claim 7 wherein the step of determining the connection status of the conductive element based at least in part on the first voltage and the second voltage comprises comparing the first voltage to a first voltage threshold, comparing the second voltage to a second voltage threshold, and providing an indication of the connection status of the conductive element according to a function of the first voltage as compared to the first voltage threshold and the second voltage as compared to the second threshold.

10. The method of claim 7 wherein the step of determining the connection status of the conductive element based at least in part on the first voltage and the second voltage comprises comparing a difference between the first voltage and an initial voltage to a first threshold to make a first comparison, comparing a difference between the second voltage and the initial voltage to a second voltage threshold to make a second comparison, and providing an indication of the connection status of the conductive element according to the first comparison and the second comparison.

11. The method of claim 7 wherein the step of pushing current into the conductive element comprises:
   pushing a first current at a first interval; and
   pushing a second current at a second interval.

12. The method of claim 11 wherein the step of pushing the first current at the first interval comprises pushing a current of about 1 milliampere to determine whether the conductive element is connected to a sensing circuit; and wherein the step of pushing the second current at the second interval comprises pushing a current of about 10 microamperes to determine a degradation of the connection between the conductive element and the sensing circuit.

13. The method of claim 7 further comprising:
   determining an imbalance of charge between the first battery cell and the second battery cell;
   correcting the imbalance of charge between the first battery cell and the second battery cell by pushing current or pulling current via the conductive element.

14. A battery cell tab monitoring apparatus electrically connected to a conductive element which is connected to a first battery cell and a second battery cell, the apparatus comprising:
   a first pull-down current source connected to periodically pull a first current from the conductive element for a first amount of time;
   a first pull-up current source connected to periodically push current approximately equal to the first current into the conductive element for approximately the first amount of time;
   a second pull-down current source connected to periodically pull a second current from the conductive element for a second amount of time;
   a second pull-up current source connected to periodically drive current approximately equal to the second current into the conductive element for approximately the second amount of time;
   a controller circuit connected to control operation of the first pull-down current source, the first pull-up current source, the second pull-down current source, and the second pull-up current source;
   a voltage measuring circuit connected to sense voltages during operation of the first pull-down current source, the first pull-up current source, the second pull-down current source, and the second pull-up current source; and
   the controller circuit connected to determine a status of the conductive element based at least in part on the measured voltages such that the controller circuit compares voltages during operation of at least one of the first pull-down current source and the first pull-up current source to a first fixed or variable voltage threshold and the controller circuit compares voltages during operation of at least one of the second pull-down current source and the second pull-up current source to a second fixed or variable voltage threshold.

15. The battery cell tab monitoring apparatus of claim 14 wherein the controller circuit receives information regarding relative charge of the first battery cell and the second battery cell and the controller circuit operates the second pull-up current source and the second pull-down current source to balance the relative charge of the first battery cell and the second battery cell.

16. The battery cell tab monitoring apparatus of claim 14 wherein the first current comprises about 1 milliampere of current and the second current comprises about 10 microamperes of current.

17. The battery cell tab monitoring apparatus of claim 14 wherein the first pull-down current source and the first pull-up current source are controlled by at least one hardware based controller and wherein the second pull-down current source and the second pull-up current source are controlled by at least one firmware based controller.

* * * * *